United States Patent
Woodruff et al.

(10) Patent No.: US 7,334,826 B2
(45) Date of Patent: Feb. 26, 2008

(54) END-EFFECTORS FOR HANDLING MICROELECTRONIC WAFERS

(75) Inventors: Daniel J. Woodruff, Kalispell, MT (US); Randy A. Harris, Kalispell, MT (US); James J. Erickson, Kalispell, MT (US); Douglas W. Carr, Richmond, CA (US)

(73) Assignee: Semitool, Inc., Kalispell, MT (US)

( * ) Notice: Subject to any disclaimer, the term of this patent is extended or adjusted under 35 U.S.C. 154(b) by 495 days.

(21) Appl. No.: 10/194,939

(22) Filed: Jul. 11, 2002

(65) Prior Publication Data

US 2003/0085582 A1    May 8, 2003

Related U.S. Application Data

(60) Provisional application No. 60/305,388, filed on Jul. 13, 2001, provisional application No. 60/305,335, filed on Jul. 13, 2001.

(51) Int. Cl.
*B65G 49/07* (2006.01)
*B25J 19/02* (2006.01)

(52) U.S. Cl. .................. 294/103.1; 294/907; 414/941

(58) Field of Classification Search ............ 294/103.1, 294/1.1, 907; 414/941
See application file for complete search history.

(56) References Cited

U.S. PATENT DOCUMENTS

| 4,451,197 | A |   | 5/1984  | Lange               |
|-----------|---|---|---------|---------------------|
| 4,639,028 | A |   | 1/1987  | Olson               |
| 4,670,126 | A |   | 6/1987  | Messer              |
| 4,744,713 | A |   | 5/1988  | Hrovath             |
| 4,770,590 | A |   | 9/1988  | Hugues              |
| 4,944,650 | A | * | 7/1990  | Matsumoto ........ 414/941 |
| 5,022,695 | A | * | 6/1991  | Ayers ............ 414/941 |
| 5,044,752 | A | * | 9/1991  | Thurfjell et al. ..... 414/937 |
| 5,133,635 | A | * | 7/1992  | Malin et al. ........ 414/941 |
| 5,178,512 | A |   | 1/1993  | Skrobak             |
| 5,201,838 | A |   | 4/1993  | Roudaut             |
| 5,445,486 | A | * | 8/1995  | Kitayama et al. ..... 414/937 |
| 5,460,478 | A |   | 10/1995 | Akimoto             |
| 5,483,138 | A | * | 1/1996  | Shmookler et al. .... 318/568.16 |
| 5,639,206 | A |   | 6/1997  | Oda                 |
| 5,669,752 | A | * | 9/1997  | Moon ............. 414/941 |
| 5,711,646 | A |   | 1/1998  | Ueda                |
| 5,746,565 | A |   | 5/1998  | Tepolt              |
| 5,759,006 | A |   | 6/1998  | Miyamoto            |
| 5,810,935 | A | * | 9/1998  | Lee et al. ........ 414/941 |
| 5,980,194 | A | * | 11/1999 | Freerks et al. ...... 414/941 |
| 6,080,691 | A |   | 6/2000  | Lindsay et al.      |
| 6,084,215 | A |   | 7/2000  | Furuya              |
| 6,109,677 | A | * | 8/2000  | Anthony ........... 294/103.1 |
| 6,113,165 | A | * | 9/2000  | Wen et al. ......... 294/907 |

(Continued)

OTHER PUBLICATIONS

U.S. Appl. No. 09/733,608, Weaver.

(Continued)

*Primary Examiner*—Saul Rodriguez
*Assistant Examiner*—Paul T Chin
(74) *Attorney, Agent, or Firm*—Perkins Coie LLP

(57) ABSTRACT

End-effectors may be used to grasp microelectronic workpieces for handling by automated transport devices. One such end-effector includes a plurality of abutments and a detector adapted to detect engagement of the edge of the workpiece by at least one of the abutments.

9 Claims, 10 Drawing Sheets

U.S. PATENT DOCUMENTS

| | | | |
|---|---|---|---|
| 6,116,848 A * | 9/2000 | Thomas et al. | 414/941 |
| 6,136,163 A | 10/2000 | Cheung et al. | |
| 6,228,232 B1 | 5/2001 | Woodruff et al. | |
| 6,256,555 B1 * | 7/2001 | Bacchi et al. | 294/88 |
| 6,275,748 B1 * | 8/2001 | Bacchi et al. | 414/941 |
| 6,280,583 B1 | 8/2001 | Woodruff et al. | |
| 6,303,010 B1 | 10/2001 | Woodruff et al. | |
| 6,309,520 B1 | 10/2001 | Woodruff et al. | |
| 6,309,524 B1 | 10/2001 | Woodruff et al. | |
| 6,318,951 B1 | 11/2001 | Schmidt et al. | |
| 6,322,119 B1 | 11/2001 | Schmidt et al. | |
| 6,322,312 B1 | 11/2001 | Sundar | |
| 6,326,755 B1 * | 12/2001 | Babbs et al. | 901/45 |
| 6,409,453 B1 * | 6/2002 | Brodine et al. | 414/941 |
| 6,453,214 B1 * | 9/2002 | Bacchi et al. | 414/757 |
| 6,467,827 B1 * | 10/2002 | Ardezzone | 294/907 |
| 6,471,913 B1 | 10/2002 | Weaver et al. | |
| 6,491,330 B1 * | 12/2002 | Mankame et al. | 294/103.1 |
| 6,569,297 B2 | 5/2003 | Wilson et al. | |
| 6,612,589 B2 | 9/2003 | Saito | |
| 6,631,935 B1 * | 10/2003 | Casarotti et al. | 414/941 |
| 6,660,137 B2 | 12/2003 | Wilson et al. | |
| 6,678,581 B2 | 1/2004 | Hung | |
| 6,685,422 B2 | 2/2004 | Sundar | |
| 6,692,049 B2 * | 2/2004 | Holbrooks | 294/103.1 |
| 6,749,390 B2 | 6/2004 | Woodruff | |
| 6,752,584 B2 * | 6/2004 | Woodruff et al. | 414/744.5 |
| 6,961,639 B2 * | 11/2005 | Gaudon et al. | 414/941 |
| 2003/0082042 A1 | 5/2003 | Woodruff | |
| 2003/0085582 A1 | 5/2003 | Woodruff et al. | |
| 2003/0159921 A1 | 8/2003 | Harris et al. | |

OTHER PUBLICATIONS

U.S. Appl. No. 10/729,349, Klocke.
U.S. Appl. No. 10/861,899, Hanson.
Integral Spin Coater/Processor; A- No. 1 Proof TR8000 Series; 8 pages; TAZMO, Ltd.; Japan, date unknown.

* cited by examiner

END-EFFECTORS FOR HANDLING MICROELECTRONIC WAFERS

CROSS-REFERENCE TO RELATED APPLICATION(S)

This application claims the benefit of U.S. Provisional Patent Application Ser. No. 60/305,388, filed Jul. 13, 2001, and U.S. Provisional Patent Application No. 60/305,335 filed Jul. 13, 2001, both currently pending and incorporated herein in its entirety by reference.

The following applications identified in paragraphs (a)-(k) are herein incorporated by reference:

(a) U.S. application Ser. No. 09/386,566, filed Aug. 31, 1999, entitled "IMPROVED ROBOT FOR MICROELECTRONIC WORKPIECE HANDLING;"

(b) U.S. application Ser. No. 09/386,590, filed Aug. 31, 1999, and entitled "ROBOTS FOR MICROELECTRONIC WORKPIECE HANDLING;"

(c) U.S. application Ser. No. 08/990,107, filed Dec. 15, 1997, entitled "SEMICONDUCTOR APPARATUS HAVING LINEAR CONVEYOR SYSTEM;"

(d) U.S. application Ser. No. 09/114,105, filed Jul. 11, 1998, entitled "IMPROVED ROBOT FOR MICROELECTRONIC WORKPIECE HANDLING." All of which are herein incorporated by reference. Additionally, this application is related to the following:

(e) U.S. patent application Ser. No. 09/875,428, entitled "INTEGRATED TOOLS WITH TRANSFER DEVICES FOR HANDLING MICROELECTRONIC WORKPIECES," filed on 5 Jun. 2001

(f) U.S. patent application Ser. No. 09/875,304, entitled "DISTRIBUTED POWER SUPPLIES FOR MICROELECTRONIC WORKPIECE PROCESSING TOOLS," filed on 5 Jun. 2001;

(g) U.S. patent application Ser. No. 09/875,365, entitled "ADAPTABLE ELECTROCHEMICAL PROCESSING CHAMBER," filed on 5 Jun. 2001;

(h) U.S. patent application Ser. No. 09/875,424, entitled "LIFT AND ROTATE ASSEMBLY FOR USE IN A WORKPIECE PROCESSING STATION AND A METHOD OF ATTACHING THE SAME," filed on 5 Jun. 2001;

(i) U.S. patent application Ser. No. 09/872,151, entitled "APPARATUS AND METHODS FOR ELECTROCHEMICAL PROCESSING OF MICROELECTRONIC WORKPIECES," filed on 31 May 2001;

(j) U.S. patent application Ser. Nos. 09/866,391 and 09/866,463, each entitled "TUNING ELECTRODES USED IN A REACTOR FOR ELECTROCHEMICALLY PROCESSING A MICROELECTRONIC WORKPIECE," filed on 24 May 2001;

(k) U.S. patent application Ser. No. 09/875,300, entitled "TRANSFER DEVICES FOR HANDLING MICROELECTRONIC WORKPIECES WITHIN AN ENVIRONMENT OF A PROCESSING MACHINE AND METHODS OF MANUFACTURING AND USING SUCH DEVICES IN THE PROCESSING OF MICROELECTRONIC WORKPIECES," filed on 5 Jun. 2001.

TECHNICAL FIELD

The present invention relates to equipment for handling microelectronic workpieces.

BACKGROUND

Microelectronic devices, such as semiconductor devices and field emission displays, are fabricated on and/or in microelectronic workpieces using several different apparatus ("tools"). Many such processing apparatus have a single processing station that performs one or more procedures on the workpieces. Other processing apparatus have a plurality of processing stations that perform a series of different procedures on individual workpieces or batches of workpieces. The workpieces are generally handled within the processing apparatus by automatic handling equipment (i.e., robots) because microelectronic fabrication requires extremely clean environments, very precise positioning of the workpieces, and conditions that are not suitable for human access (e.g., vacuum environments, high temperatures, chemicals, etc.).

An increasingly important category of processing apparatus are plating tools that plate metals and other materials onto workpieces. Existing plating tools use automatic handling equipment to handle the workpieces because the position, movement and cleanliness of the workpieces are important parameters for accurately plating materials onto the workpieces. The plating tools can be used to plate metals and other materials (e.g., ceramics or polymers) in the formation of contacts, interconnects and other components of microelectronic devices. For example, copper plating tools are used to form copper contacts and interconnects on semiconductor wafers, field emission displays, read/write heads and other types of microelectronic workpieces. A typical copper plating process involves depositing a copper seed layer onto the surface of the workpiece using chemical vapor deposition (CVD), physical vapor deposition (PVD), electroless plating processes, or other suitable methods. After forming the seed layer, copper is plated onto the workpiece by applying an appropriate electrical field between the seed layer and an anode in the presence of an electrochemical plating solution. The workpiece is then cleaned, etched and/or annealed in subsequent procedures before transferring the workpiece to another apparatus.

Single-wafer plating tools generally have a load/unload station, a number of plating chambers, a number of cleaning chambers, and a transfer mechanism for moving the microelectronic workpieces between the various chambers and the load/unload station. The transfer mechanism can be a rotary system having one or more robots that rotate about a fixed location in the plating tool. One existing rotary transfer mechanism is shown in U.S. Pat. No. 6,136,163 issued to Cheung, et al., which is herein incorporated by reference in its entirety. Alternate transfer mechanisms include linear systems that have an elongated track and a plurality of individual robots that can move independently along the track. Each of the robots on a linear track can also include independently operable end-effectors. Existing linear track systems are shown in U.S. Pat. No. 5,571,325 issued to Ueyama, et al., PCT Publication No. WO 00/02808, and U.S. patent application Ser. Nos. 09/386,566; 09/386,590; 09/386,568; and 09/759,998, all of which are herein incorporated in their entirety by reference. Many rotary and linear transfer mechanisms have a plurality of individual robots that can each independently access most, if not all, of the processing stations within an individual tool to increase the flexibility and throughput of the plating tool.

These robots use end-effectors to grasp the workpiece in moving the workpiece from one processing station to another. The nature and design of the end-effectors will depend, in part, on the nature of the workpiece being handled. In some circumstances, the backside of the workpiece is not overly sensitive and may be contacted by the end-effector. In such circumstances, a vacuum-based end-effector may be used. Such vacuum-based end-effectors typically have a vacuum plenum having a plurality of vacuum outlets.

Some workpieces are not tolerant of such contact, though. Such workpieces typically must be handled by their edges and the distance inwardly from the edge of a workpiece which handling equipment may contact is strictly proscribed. This significantly limits the area of contact between the end-effectors and the workpieces, making it more difficult to securely grasp the workpiece during handling. If the workpiece is not grasped adequately, it may slide off the end-effector during movement of the robot in transferring the workpiece from one processing station to another. This problem is particularly acute where the end-effector is rotated to flip the workpiece from one horizontal orientation to an inverse horizontal orientation, e.g., to properly position a semiconductor wafer in an electroplating chamber.

It would be advantageous to confirm that a workpiece is properly positioned on and grasped by an end-effector before the end-effector moves the workpiece. International Publication No. WO 00/02808, which is incorporated herein in its entirety by reference, suggests using light reflected off the workpiece to determine the presence of a workpiece. A lack of reflected light indicates that no workpiece is present. While such a system does indicate whether a workpiece is in the proper vicinity, it does not ensure that the end-effector has properly grasped the workpiece.

Most current end-effectors use three spaced-apart points of contact with the workpiece to define a plane within which the workpiece will be received. Such three-point contact is able to adapt to minor dimensional differences from one workpiece to the next. Grasping the edge of the workpiece at four locations can lead to a more secure grip of a workpiece which is precisely the anticipated size. If the workpiece falls outside of very narrowly proscribed tolerances, however, it is difficult to ensure that all four contact points are gripping the edge of the workpiece with sufficient force to securely hold the workpiece to the end-effector.

SUMMARY

The present invention is directed toward various end-effectors for handling microelectronic workpieces and methods of handling microelectronic workpieces. Certain embodiments of the invention provide end-effectors having detectors capable of monitoring operation of the end-effector and, if so desired, generate an error signal if a workpiece is not properly engaged by the end-effector. This can significantly reduce the likelihood that a workpiece will be inadvertently dropped because it is not properly gripped by the end-effector.

One specific embodiment of the invention provides an end-effector for handling a microelectronic workpiece including a body. A plurality of spaced-apart abutments are carried by the body and the plurality of abutments may define a workpiece-receiving area. An actuator is also carried by the body and is associated with at least one of the abutments. The actuator is adapted to move such an associated abutment inwardly toward the workpiece-receiving area from a retracted position. A detector is operatively associated with the actuator and is adapted to generate an error signal if the associated abutment fails to engage an edge of a workpiece when the actuator moves the associated abutment inwardly. Such an error signal enables intervention in operation of a transfer device to avoid dropping or misplacement of the workpiece.

In accordance with another embodiment of the invention, an end-effector has a body and a plurality of abutments carried by the body at locations adapted to selectively engage an edge of a workpiece. A detector is adapted to detect engagement of the edge of the workpiece by at least one of the abutments. If so desired, the end-effector may also include an actuator associated with at least one of the abutments and the detector may detect a position of the actuator, e.g., by detecting the position of a flag carried by the actuator. In one application of this embodiment, the detector generates an error signal if the actuator moves inwardly a distance greater than a predetermined distance which corresponds to positive engagement of the workpiece by the abutment associated with the actuator. If the actuator moves in too far, this may be an indication that no workpiece is present or, even if it is present, it is not adequately grasped by the abutments to permit safe transfer of the workpiece to another processing station.

In accordance with another embodiment, an end-effector for handling microelectronic workpieces includes a body and three abutments carried by the body which together defining a workpiece-receiving area. These abutments include spaced-apart, stationary first and second abutments and a moveable third abutment carried by the body opposite the first and second abutments. The end-effector also includes an actuator comprising a shaft having an inward end carrying the third abutment. The shaft is adapted to move inwardly from a retracted position, e.g., for loading a workpiece in the workpiece-receiving area, to a deployed position wherein the third abutment engages the workpiece. The end-effector also includes a detector having spaced-apart first and second position sensors positioned adjacent a path of travel of the actuator. The first position sensor may generate a first signal when the actuator moves inwardly a predetermined distance from the retracted position and the second position sensor may generate a second signal when the actuator moves inwardly beyond the deployed position. The detector may generate an error signal if the second position sensor generates the second signal. This provides a reliable means for detecting whether the workpiece is properly engaged by the end-effector, avoiding mishaps encountered when workpieces are not gripped adequately during handling.

If so desired, any one or more of these end-effectors may be included in a transfer device. The transfer device may include a transport unit configured to move along a transport path, a lift assembly carried by the transport unit, an arm carried by the lift assembly, and at least one end-effector. If so desired, two or more end-effectors may be provided on the arm.

Another embodiment of the invention provides a method of grasping a microelectronic workpiece. This method includes providing an end-effector having a plurality of abutments, an actuator, and a detector. At least one of these abutments is a moveable abutment. A microelectronic workpiece is positioned between the abutments of the end-effector. The moveable abutment is moved inwardly using the actuator and action of the actuator is monitored using the detector. An error signal may be generated if the moveable abutment fails to engage an edge of the workpiece.

DETAILED DESCRIPTION

The following description discloses the details and features of several embodiments of end-effectors for handling microelectronic workpieces, and methods for using such devices. The term "microelectronic workpiece" is used throughout to include a workpiece formed from a substrate upon which and/or in which microelectronic circuits or components, data storage elements or layers, and/or micromechanical elements are fabricated. It will be appreciated that several of the details set forth below are provided to describe the following embodiments in a manner sufficient to enable a person skilled in the art to make and use the disclosed embodiments. Several of the details and advantages described below, however, may not be necessary to practice certain embodiments of the invention. Additionally, the invention can also include additional embodiments that are within the scope of the claims, but are not described in detail with respect to FIGS. 1-14.

The operation and features of the transfer devices for handling microelectronic workpieces are best understood in light of the environment and equipment in which they can be used. As such, several embodiments of processing apparatus in which the transfer devices can be used will be described with reference to FIGS. 1 and 2. The details and features of several embodiments of transfer devices will then be described with reference to FIGS. 3-14.

Figure 1:
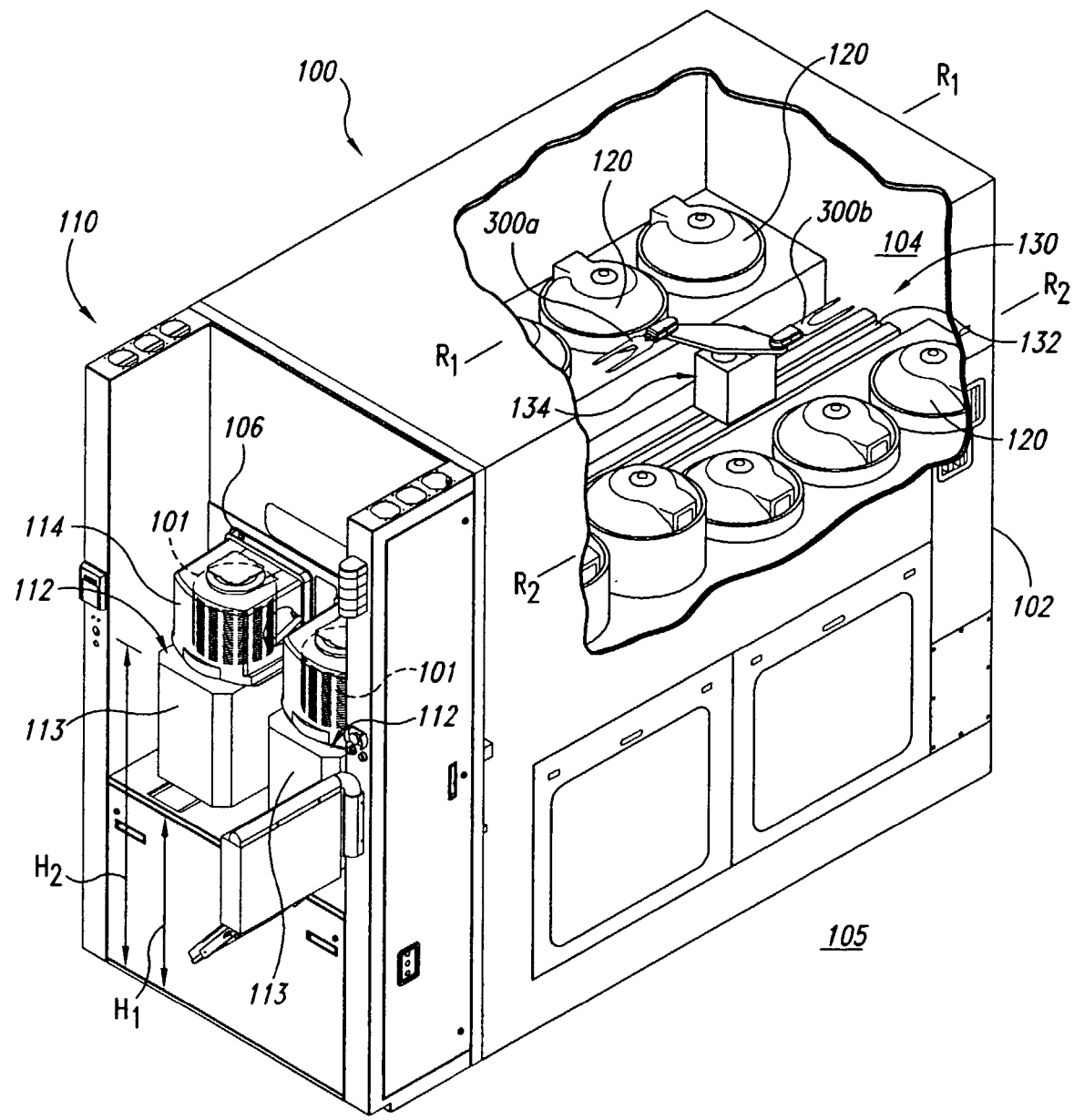
FIG. 1 is an isometric view of a processing apparatus for processing microelectronic workpieces including a transfer device for handling the workpieces in accordance with an embodiment of the invention. A portion of the processing apparatus is shown in a cut-away illustration.

A. Selected Embodiments Of Microelectronic Workpiece Processing Apparatus For Use With Automatic Workpiece Transfer Devices FIG. 1 is an isometric view of a processing apparatus 100 having a workpiece handling device 130 in accordance with an embodiment of the invention for manipulating a plurality of microelectronic workpieces 101. A portion of the processing apparatus 100 is shown in a cut-away view to illustrate selected internal components. In one aspect of this embodiment, the processing apparatus 100 can include a cabinet 102 having an interior region 104 defining an enclosure that is at least partially isolated from an exterior region 105. The cabinet 102 can also include a plurality of apertures 106 through which the workpieces 101 can ingress and egress between the interior region 104 and a load/unload station 110.

The load/unload station 110 can have two container supports 112 that are each housed in a protective shroud 113. The container supports 112 are configured to position workpiece containers 114 relative to the apertures 106 in the cabinet 102. The workpiece containers 114 can each house a plurality of microelectronic workpieces 101 in a "mini" clean environment for carrying a plurality of workpieces through other environments that are not at clean room standards. Each of the workpiece containers 114 is accessible from the interior region 104 of the cabinet 102 through the apertures 106.

The processing apparatus 100 can also include a plurality of processing stations 120 and a transfer device 130 in the interior region 104 of the cabinet 102. The processing apparatus, for example, can be a plating tool, and the processing stations 120 can be single-wafer chambers for electroplating, electroless plating, annealing, cleaning, etching, and/or metrology analysis. Suitable processing stations 120 for use in the processing apparatus 100 are disclosed in U.S. Pat. Nos. 6,228,232 and 6,080,691, and in U.S. application Ser. Nos. 09/385,784; 09/386,803; 09/386,610; 09/386,197; 09/501,002; 09/733,608; 09/804,696; and 09/804,697, all of which are herein incorporated in their entirety by reference. The processing stations 120 are not limited to plating devices, and thus the processing apparatus 100 can be another type of tool.

The transfer device 130 moves the microelectronic workpieces 101 between the workpiece containers 114 and the processing stations 120. The transfer device 130 includes a linear track 132 extending in a lengthwise direction of the interior region 104 between the processing stations 120. In the particular embodiment shown in FIG. 1, a first set of processing stations 120 is arranged along a first row $R_1$-$R_1$ and a second set of processing stations 120 is arranged along a second row $R_2$-$R_2$. The linear track 130 extends between the first and second rows of processing stations 120. The transfer device 130 can further include a robot unit 134 carried by the track 132.

Figure 2A:
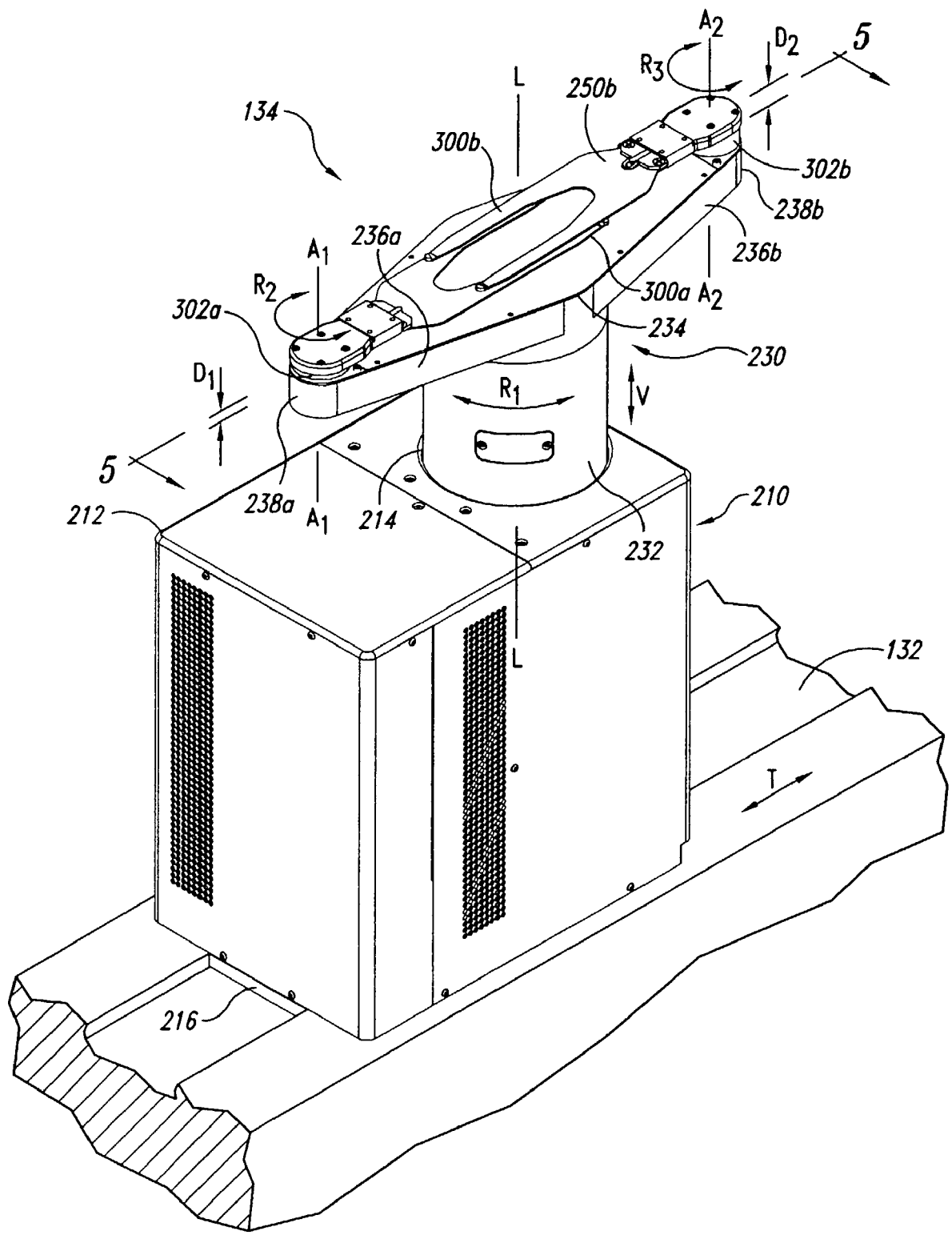
FIGS. 2A and 2B are isometric views of transfer devices for handling microelectronic workpieces in accordance with embodiments of the invention.

B. Embodiments Of Transfer Devices For Handling Microelectronic Workpieces In Processing Machines FIG. 2A illustrates an embodiment of the robot unit 134 in greater detail. The robot unit 134 can include a transport unit 210, an arm assembly 230 carried by the transport unit 210, and first and second end-effectors 300 (identified individually by reference numbers 300a and 300b) carried by the arm assembly 230. The transport unit 210 can include a shroud or housing 212 having a plurality of panels attached to an internal frame (not shown in FIG. 2A). An opening 214 in a top panel of the housing 212 receives a portion of the arm assembly 230. It will be appreciated that the transport unit 210 and the housing 212 can have many different configurations depending upon the particular environment in which the robot unit 134 is used. The transport unit 210, for example, can be a base that can be stationary, rotary, or move in a non-linear manner. The transport unit 210 can also include a guide member configured to move laterally along the track 132. The particular embodiment of the transport unit 210 shown in FIG. 2A includes a guide member defined by a base plate 216 that slidably couples the robot unit 134 to the track 132. The robot unit 134 can accordingly translate along the track 132 (arrow T) to position the robot unit 134 adjacent to a desired processing station 120 (FIG. 1).

The arm assembly 230 can include a waist member 232 that is coupled to a lift assembly (not shown in FIG. 2A). The arm assembly 230 can also include an arm 234 having a medial section 235, a first extension 236a projecting from one side of the medial section 235, and a second extension 236b extending from another side of the medial section 235. The first and second extensions 236a-b of the arm 234 can be diametrically opposed to one another as shown in FIG. 2A, or they can extend at a desired angle to each other. In one embodiment, the first and second extensions 236a and 236b are integral with another, but in alternate embodiments the first and second extensions 236a and 236b can be individual components that are fixed to each other.

The arm assembly 230 can move along a lift path L-L to change the elevation of the arm 234 for positioning the end-effectors 300 at desired elevations. The lift path L-L generally extends transverse to the track 132, which as used herein includes any oblique or perpendicular arrangement. The arm assembly 230 can also rotate (arrow $R_1$) about the lift path L-L to position a distal end 238a of the first extension 236a and/or a distal end 238b of the second extension 236b proximate to a desired workpiece container 114 or processing station 120. The first and second extensions 236a-b generally rotate about the lift path L-L as a single unit because they are integral or fixed with each other. The motion of the first and second extensions 236a-b are accordingly dependent upon each other in this embodiment. In alternate embodiments, the arm 234 can have extensions that are not fixed to each other and can move independently from each other.

The end-effectors 300 are rotatably carried by the arm 234. In one embodiment, the first end-effector 300a is rotatably coupled to the first distal end 238a to rotate about a first rotation axis $A_1$-$A_1$ (arrow $R_2$). The second end-effector 300b can be rotatably coupled to the second distal end 238b of the arm 234 to rotate about a second rotation axis $A_2$-$A_2$ (arrow $R_3$). The first and second rotation axes $A_1$-$A_1$ and $A_2$-$A_2$ can extend generally parallel to the lift path L-L, but in alternate embodiments these axes can extend transverse to the lift path L-L. The rotational motion of (a) the arm 234 about the lift path L-L, (b) the first end-effector 300a about the first rotation axis $A_1$-$A_1$, and (c) the second end-effector 300b about the second rotation axis $A_2$-$A_2$ can be coordinated so that the first and second end-effectors 300a and 300b can each be positioned adjacent to any of the workpiece containers 114 and processing stations 120 on either side of the cabinet 102 (FIG. 1).

The first end-effector 300a can be spaced apart from the arm 234 by a first distance $D_1$, and the second end-effector 300b can be spaced apart from the arm 234 by a second distance $D_2$. In the embodiment shown in FIG. 2A, the distance $D_1$ is less than the distance $D_2$ such that the first end-effector 300a is at a different elevation than the second end-effector 300b. The first end-effector 300a accordingly moves through a first plane as it rotates about the first rotation axis $A_1$-$A_1$, and the second end-effector 300b moves through a second plane as it rotates about the second rotation axis $A_2$-$A_2$. The first and second planes are generally parallel and fixedly spaced apart from each other so that the end-effectors 300a-b cannot interfere with each other. The first and second planes, however, can have other arrangements (i.e., nonparallel) so long as they do not intersect in a region over the arm 234. The first and second end-effectors 300a and 300b can be fixed at the particular elevations relative to the arm 234 using spacers or other types of devices. For example, the first end-effector 300a can be spaced apart from the arm 234 by a first spacer 302a, and the second end-effector 300b can be spaced apart from the arm 234 by a second spacer 302b. The first and second spacers 302a-b can have different thicknesses to space the end-effectors 300 apart from the arm 234 by the desired distances.

Figure 2B:
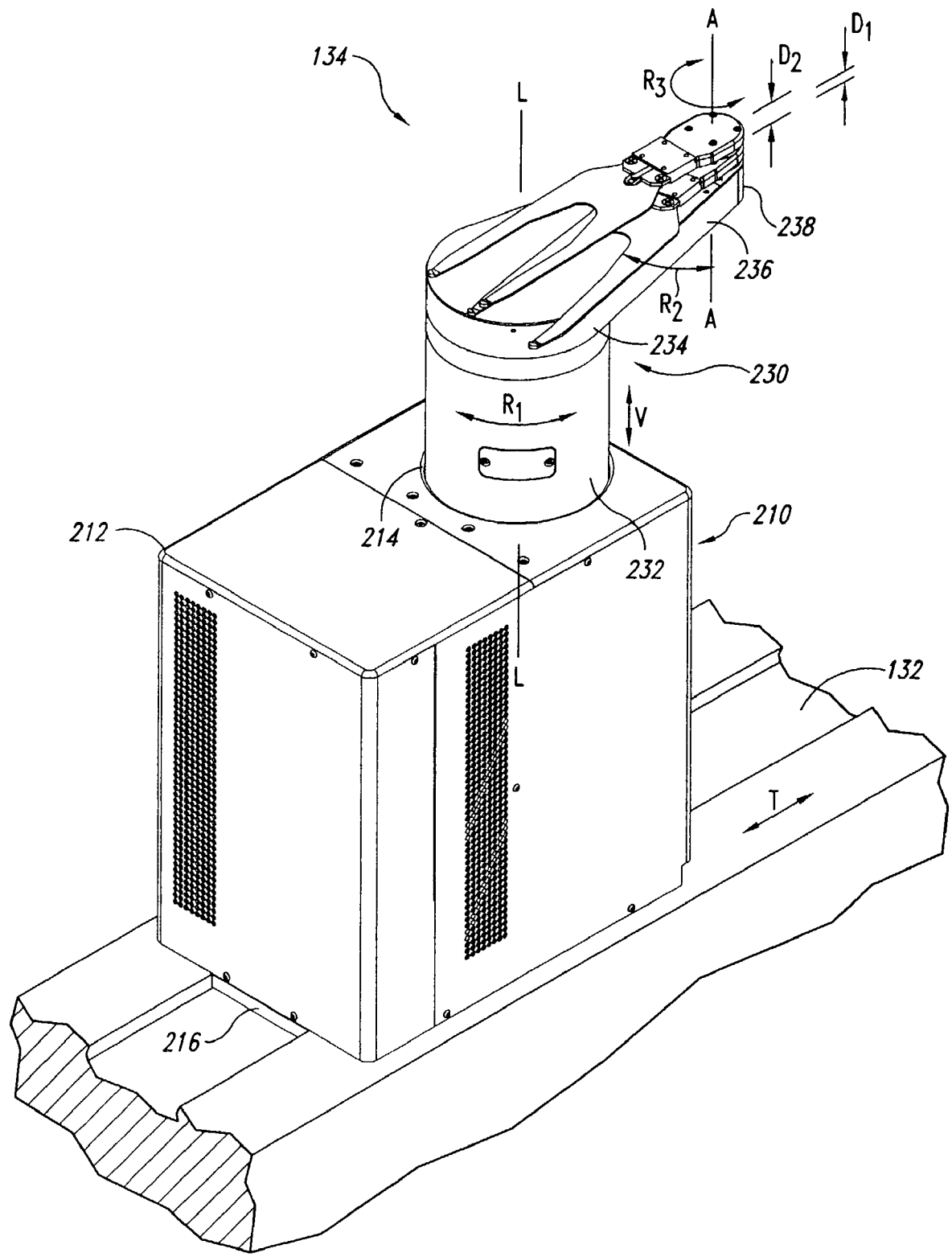

The first and second end-effectors 300a-b and the arm 234 can have different configurations than the configuration shown in FIG. 2A. For example, as shown in FIG. 2B, the arm 234 can have only a single extension 236 projecting from the waist member 232 and both of the end-effectors 300a-b can be carried by the "single-extension" arm such that the first and second end-effectors 300a-b are fixed at different elevations relative to the arm 234. The end-effectors 300a-b, for example, can be coupled to the end 238 of the arm and rotate about a common rotation axis A-A.

Figure 3:
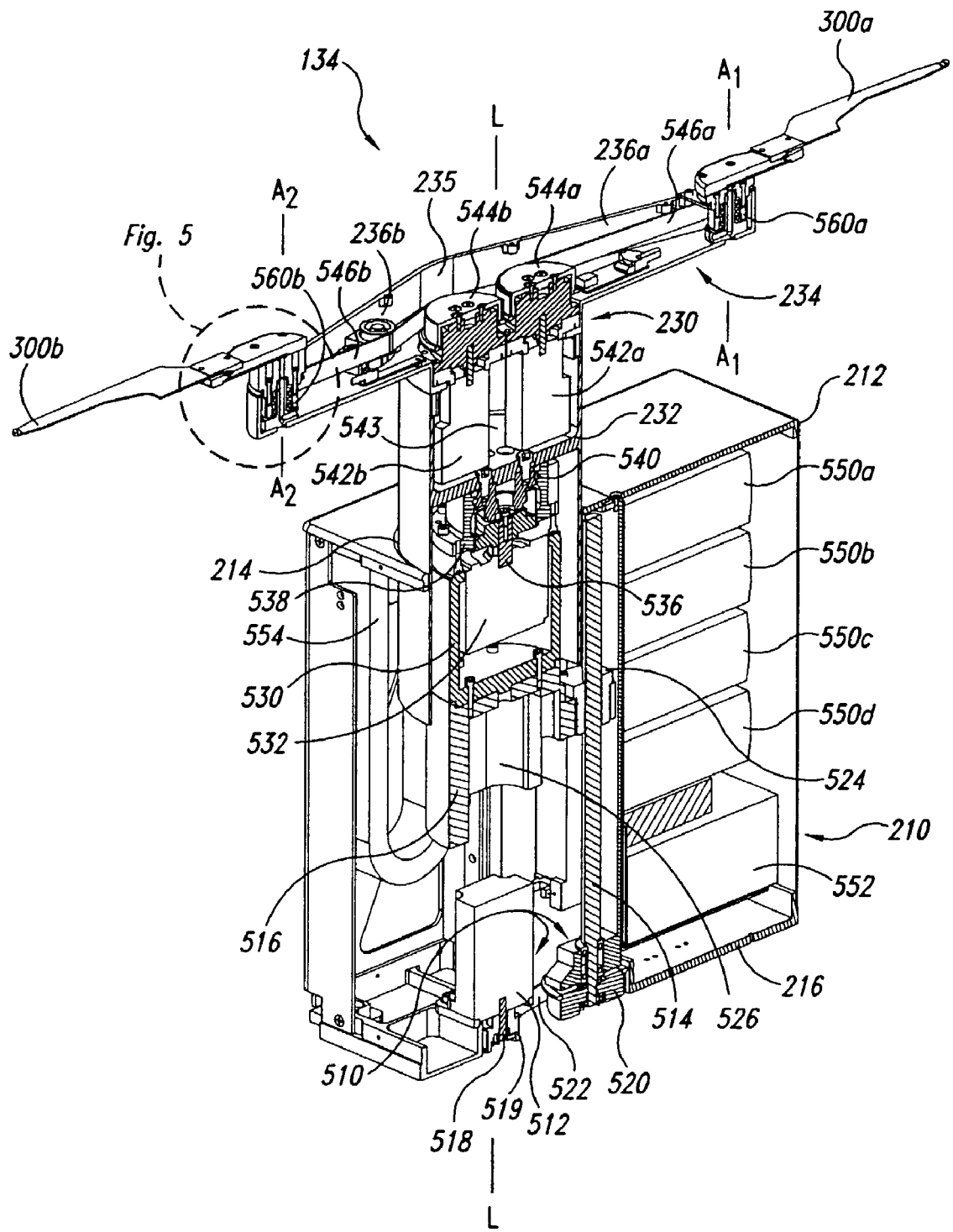
FIG. 3 is an isometric view of a transfer device for handling microelectronic workpieces in accordance with an embodiment of the invention in which selected components are shown in cross section and other components are shown schematically.

FIG. 3 illustrates one embodiment of the robot unit 134 in greater detail. In this particular embodiment, the transport unit 210 and the arm assembly 230 can operate in a manner similar to that described above with reference to FIGS. 1-2A, and thus like reference numbers refer to like components in FIGS. 1-3. The robot unit 134 can include a lift assembly 510 having a lift actuator 512, a lift member 514, and a lift platform 516 coupled to the lift member 514. The lift actuator 512 can be a servomotor, a linear actuator, or another suitable device that can provide precise control of rotational or linear motion. In the embodiment shown in FIG. 3, lift actuator 512 is a servomotor having a driveshaft 518 to which a drive pulley 519 is attached. The lift member 514 in this embodiment is a ball screw or a lead screw having a lower end securely connected to a passive pulley 520. The lift assembly 510 can also include a guide, such as a guide rail 514a. The output from the lift actuator 512 is coupled to the passive pulley 520 by a belt 522 around the drive pulley 519 and the passive pulley 520. The lift assembly 510 can further include a nut 524 that is threadedly coupled to the lead-screw lift member 514 and fixedly coupled to the lift platform 516.

The lift assembly 510 operates to raise/lower the lift platform 516 by energizing the lift actuator 512 to rotate the drive pulley 519 and produce a corresponding rotation of the lead-screw lift member 514. The nut 524 moves vertically according to the rotation of the lift member 514 to raise/lower the lift platform 516 for adjusting the elevation of the first and second end-effectors 300a and 300b. It will be appreciated that the stroke length of the nut 524 defines the extent of the lift motion of the arm assembly 230. Additionally, when the nut 524 is positioned at the lower end of the lift member 514, the lift actuator 512 is received in a cavity 526 in the lift platform 516. The cavity 526 allows the size of the robot unit 134 to be relatively compact and the length of the lift stroke to be relatively large because the lift actuator 512 can be positioned directly under the lift platform 516.

It will be appreciated that other embodiments of lift assemblies can be used to raise and lower the arm assembly 230. For example, the lift member can be a scissor lift assembly driven by a servomotor, or the driveshaft of the lift actuator 512 can be the lead-screw lift member 514 to eliminate the pulleys and belts of the embodiment of FIG. 3.

The arm assembly 230 is carried by the lift assembly 510 to move along the lift path L-L. In the embodiment shown in FIG. 3, the arm assembly 230 includes a base 530 carried by the lift platform 516 and a waist motor 532 carried by the base 530. The waist member 232 is coupled to an output shaft 536 of the waist motor 532 by a boss. The waist motor 532 is fixedly attached to the base 530, and a rim 538 is fixedly attached to the base 530 to generally enclose the boss. The waist member 232 is fixedly attached to the boss such that rotation of the boss rotates the waist member 232. A bearing 540 between the boss and the rim 538 allows the waist motor 532 to rotate the boss and the waist member 232 via the output of the driveshaft 536.

The arm assembly 230 can further include a first effector-drive 542a and a second effector-drive 542b carried in a cavity 543 of the waist member 232. The first effector-drive 542a has an output shaft coupled to a drive pulley 544a, which is coupled to a passive pulley 560a by a belt 546a. If so desired, a harmonic drive (nor shown) or other gear reduction mechanism may be disposed between the first effector-drive 542a and the drive pulley 544a to alter the angular relationship between rotation of the first effector-drive 542a and the first end effector 300a. The second effector-drive 542b can be operatively coupled to the second end-effector 300b by a similar arrangement. The second effector-drive 542b, for example, can have an output shaft connected to a drive pulley 544b, which is coupled to a passive pulley 560b by a belt 546b. In the embodiment shown in FIG. 3, the first and second effector-drives 542a and 542b are servomotors. Alternate embodiments of the arm assembly 230, however, can use linear actuators housed in the arm 234 or other types of actuators to manipulate the end-effectors 300a and 300b. For example, the effector-drives 542 can be servomotors that have output shafts with a worm gear, and the passive pulleys 560 could be replaced with gears that mesh with the worm gears. The rotation of the worm gears would accordingly rotate the end-effectors about the rotation axes.

The arm assembly 230 operates by (a) rotating the waist member 232 and the arm 234 about the lift path L-L, and (b) independently rotating the first and second end-effectors 300a and 300b about the first and second rotation axes $A_1$-$A_1$ and $A_2$-$A_2$, respectively. The waist motor 532 rotates the waist member 232 and the arm 234 about the lift path L-L to position the first and second extensions 236a and 236b of the arm 234 at desired locations relative to the workpiece containers 114 (FIG. 1) and/or the processing stations 120 (FIG. 1). The first effector-drive 542a rotates the first end-effector 300a about the first rotation axis $A_1$-$A_1$, and the second effector-drive 542b rotates the second end-effector 300b about the second rotation axis $A_2$-$A_2$. The effector-drives 542a-b operate independently from each other and the waist motor 532 so that the end-effectors 300a and 300b can move in a compound motion with the arm 234. This motion can thus translate the workpieces 101 along virtually any desired path. Therefore, the waist motor 532 and the end-drives 542a-b can operate serially or in parallel to provide the desired motion of the end-effectors 300.

The robot unit 134 can also include a plurality of amplifiers to operate the motors carried by the robot unit 134. In this embodiment, the amplifiers can include four servoamplifiers 550 (identified by reference numbers 550a-d). The amplifiers 550 operate the lift actuator 512, the waist motor 532, and the effector-drives 542a-b. Additionally, the transport unit 134 can include a servoamplifier 552 for a rail motor (not shown) that moves the transport unit 210 along the track 132 (FIG. 1). The amplifiers 550 and 552 are controlled by a control circuit board (not shown in FIG. 4) that is carried by the transport unit 210 such that much of the wiring and the electronics for the robot unit 134 are carried locally with the transport unit 210. Some of the internal wiring for the waist motor 532 and the effector-drives 542a-b is carried in a flexible cable track 554 that moves vertically with the lift platform 516. This reduces the number of long wires running through the processing apparatus 100.

Figure 4:
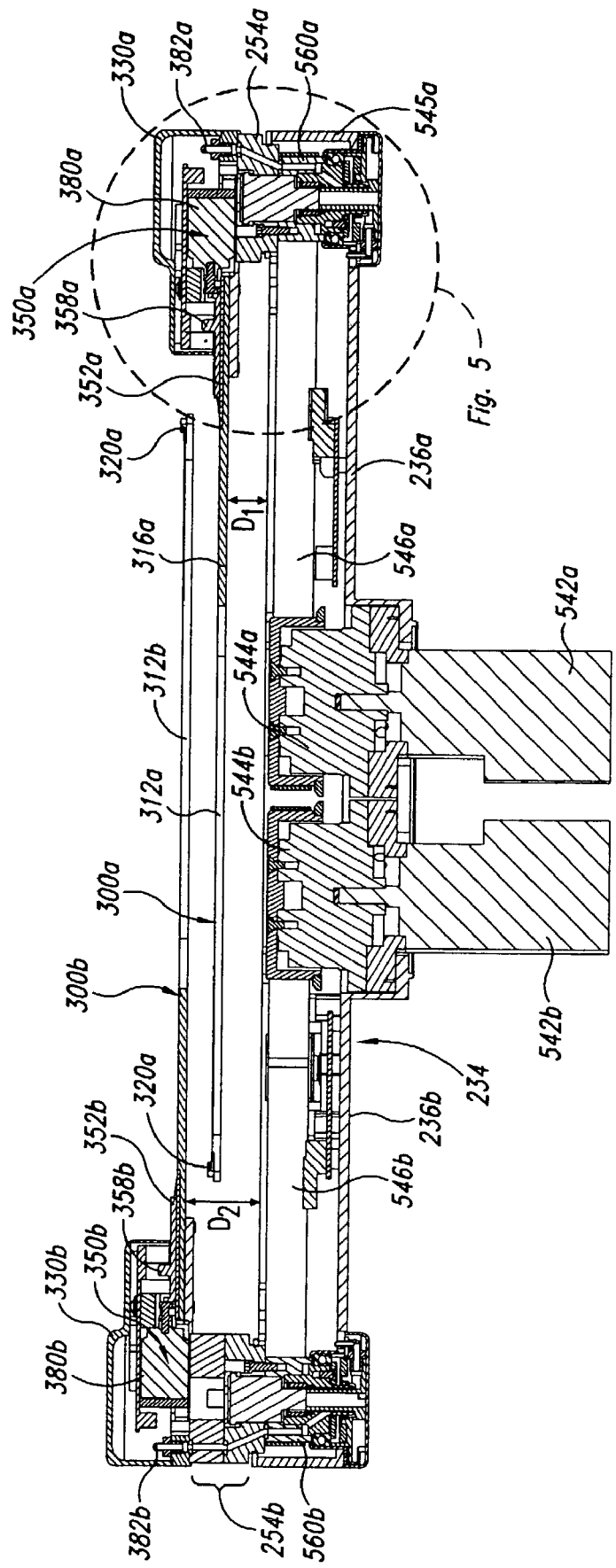
FIG. 4 is a cross-sectional view of a portion of an arm assembly of the transfer device of FIG. 3.

FIG. 4 shows the first and second end-effectors 300a and 300b in a workpiece transport position. In this configuration, the first spacer 254a spaces the first end-effector 300a apart from the arm 234 by the first distance $D_1$ and the second spacer 254b spaces the second end-effector 300b apart from the arm 234 by the second distance $D_2$. When the first and second end-effectors 250a-b are over the arm 234, a first workpiece (not shown) carried by the first end-effector 300a can be superimposed under a second workpiece (not shown) carried by the second end-effector 300b for transportation along the track 132. It will be appreciated that the first and second end-effectors 300a and 300b can be spaced apart from the arm 234 by different distances and using different techniques. The particular embodiment shown in FIG. 4 uses fixed spacers 254a and 254b to provide a fixed differential in the elevation between the first and second end-effectors 300a and 300b that mitigates the need for complex collision avoidance algorithms because the first and second workpieces are inherently held at elevations in which they cannot collide with one another or other components of the robot unit 134.

Figure 6:
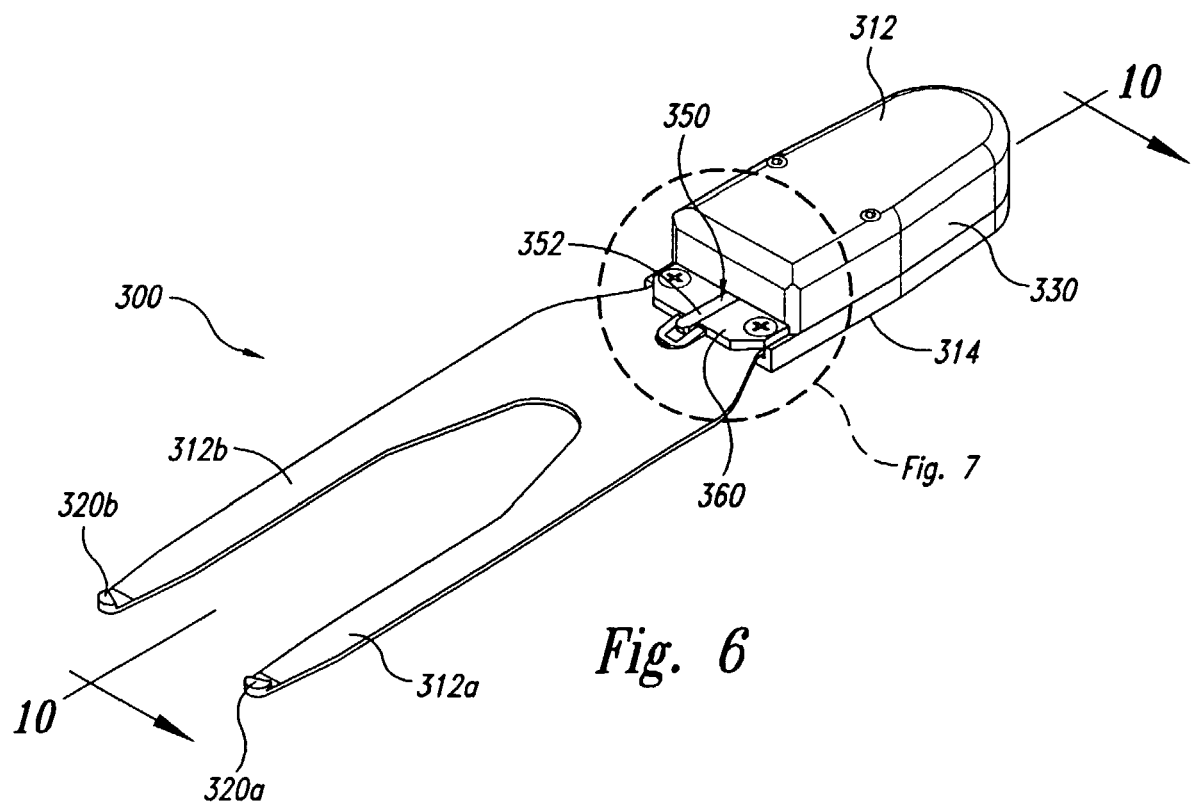
FIG. 6 is an isometric view of an end-effector in accordance with one embodiment of the invention.
Figure 7:
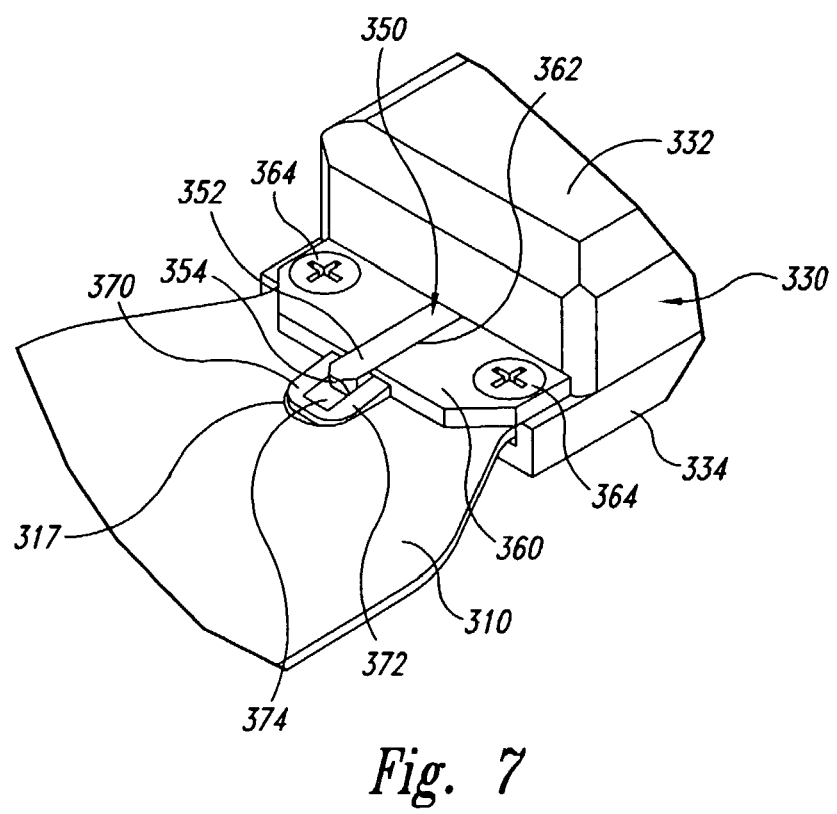
FIG. 7 is an isometric isolation view of the encircled portion of FIG. 6.

FIG. 6 illustrates the connection between the first end-effector 300a and the first extension 236a of the arm 234 in greater detail. In this embodiment, the pulley 560a is fixedly attached to the spacer 254a, and a proximal end of the end-effector 300a is fixedly attached to the spacer 254a. The belt 546a accordingly rotates the pulley 560a about the first rotation axis $A_1$-$A_1$.

Figure 5:
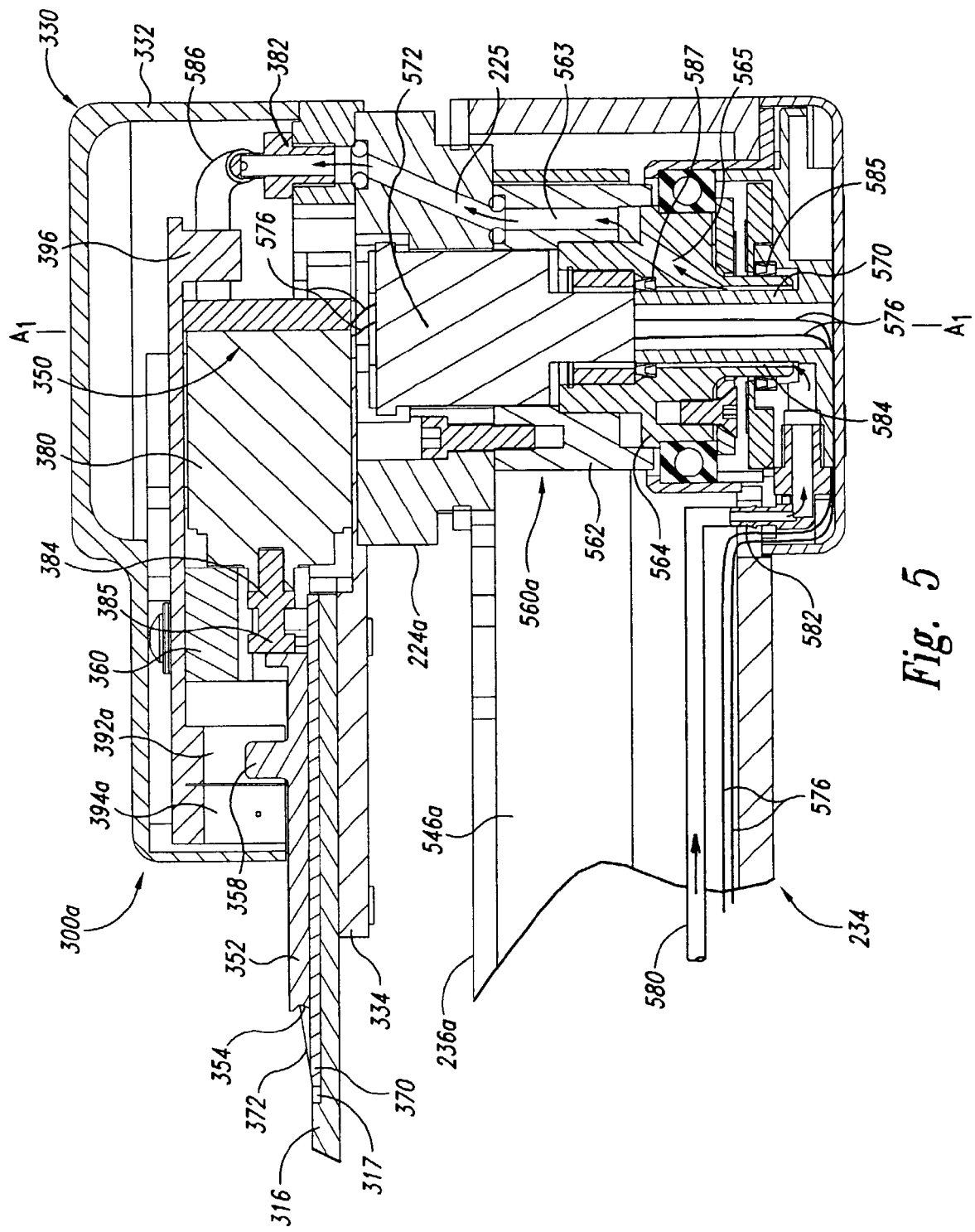
FIG. 5 is an isolation view of a portion of an end-effector of the arm assembly of FIG. 4.

The pulley 560a illustrated in FIGS. 4 and 5 includes an upper pulley section 562 and a lower pulley section 564 attached to one another for rotation together. The pulley 560a also includes an electrical pass-through including a lower wire sleeve 570 and an upper slip ring assembly 572. The wire sleeve 570 may be generally hollow and provide a passage for wires 576 upwardly through the center of the pulley 560a. The slip ring assembly 572 provides a rotatable electrical connection from the first extension 236a of the arm 234 and the first end-effector 300a, permitting power to be delivered to a detector 290 (discussed below). A variety of suitable slip ring assemblies are commercially available, including one sold by Litton Industries as model AC6023-6.

In one embodiment of the invention, detailed below in connection with FIGS. 6-14, the first end-effector 300a includes a pneumatically powered driver 380. The pulley 560a of FIG. 5 includes a pneumatic pass-through to pneumatically connect the pneumatic supply line 580 (which may be connected to a compressor in the housing 212 of the transport unit 210, for example) with a pneumatic delivery line 586 connected to the driver 380. An annular pneumatic space 584 is defined between the exterior of the wire sleeve 570 and an inner surface of the lower pulley section 564. As a consequence, the annular space 584 is concentric about the wire sleeve 570. A lower rotary seal 585 may provide a seal between a lower end of the lower pulley section 564 and the wire sleeve 570 and an upper rotary seal 587 may provide a seal between the upper end of the wire sleeve and the lower pulley section 564. This seals the annular passageway 584 without interfering with relative rotation between the wire sleeve 570 and lower pulley section 564 which define the annular passageway 584. A pressurized fluid may follow the path designed by arrows in FIG. 5, passing from the pneumatic supply line 580, into the angled pneumatic fitting 582, into the annular pneumatic space 584, into an angled channel 565 in the lower pulley section 564, into a connecting channel 563 in the upper pulley section 562, through a spacer channel 225 in the spacer 224a, and finally through a fluid fitting 382 carried in the end-effector 300a.

FIGS. 6-14 illustrate an end-effector 300 in accordance with one embodiment of the invention. The end-effector 300 may be used as the first end-effector 300a and/or the second end-effector 300b in FIGS. 1-3. It should be understood that the end-effector 300 can be used in connection with transfer devices different from those shown in FIGS. 1-3, though.

Figure 8:
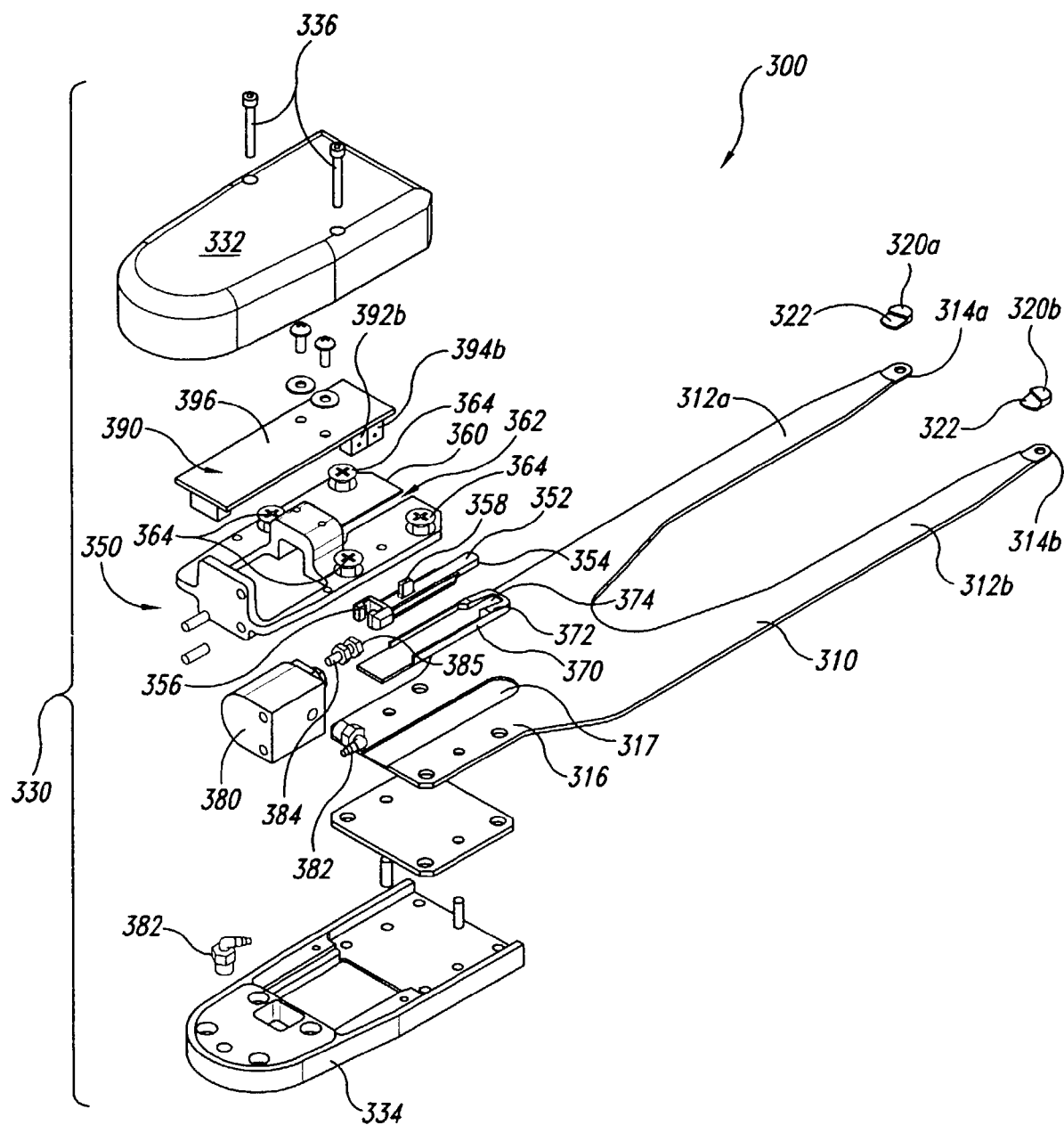
FIG. 8 is an isometric exploded view showing the components of the end-effector of FIG. 6.

The end-effector 300 of FIGS. 6-14 includes a body 310 which is appropriately sized to grasp the size and shape of workpiece with which the end-effector is intended to be used. While the body 310 can take any of a variety of shapes, the body 310 of the illustrated embodiment has a pair of spaced-apart legs 312a and 312b. The two legs 312 may be substantially symmetrical about a centerline of the body 310. The distal ends 314 of the legs 312 may be adapted to abut an edge of the workpiece. In the illustrated embodiment, the distal end 314a of the first leg 312a carries a first stationary abutment 320a and the distal end 314b of the second leg 312b carries a second stationary abutment 320b. As best seen in FIG. 8, the body 310 also includes a proximal section 316. This proximal section 316 may carry the housing 330 and an actuator 350, as explained in more detail below. The proximal section 316 may include a depression 317 for receiving a channel member 370, as also explained below.

As noted above, the distal ends 314 of the legs 312 of the base 310 may each be adapted to carry a stationary abutment 320. If so desired, the stationary abutment 320 may be formed integrally with the associated leg 312 and may take any desired shape. In the illustrated embodiment, however, the stationary abutments 320 are formed as separate members which are attached to the distal ends 314 of the legs 312, such as by press fitting, gluing, soldering or the like.

Figure 11:
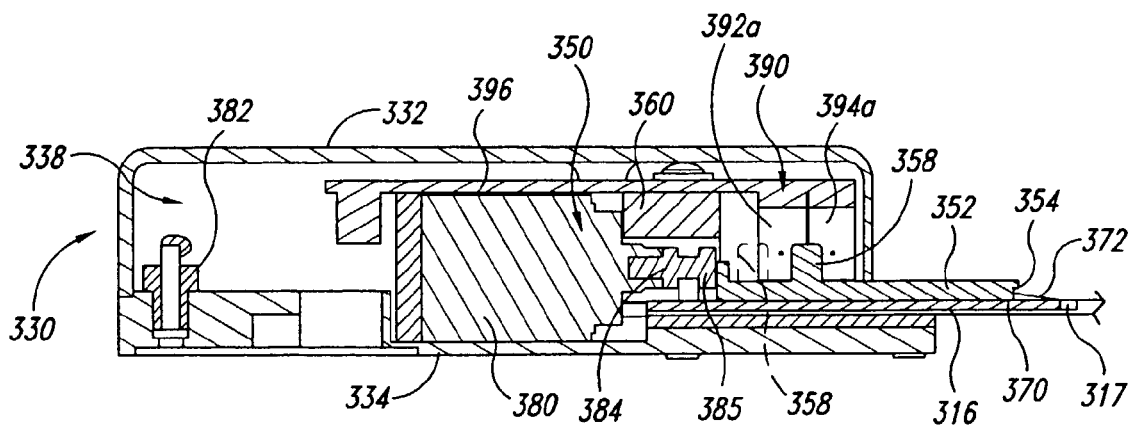
FIG. 11 is a cross-sectional isolation view of the encircled portion of FIG. 10.
Figure 12A:
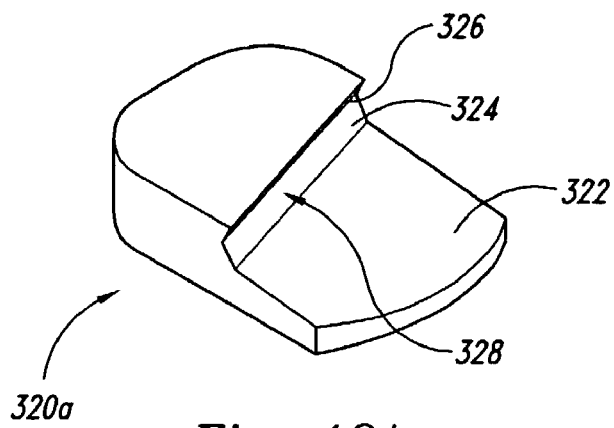
FIGS. 12A and 12B are isometric views of stationary abutments in accordance with an embodiment of the invention which are useful in the end-effector of FIG. 3.
Figure 12B:
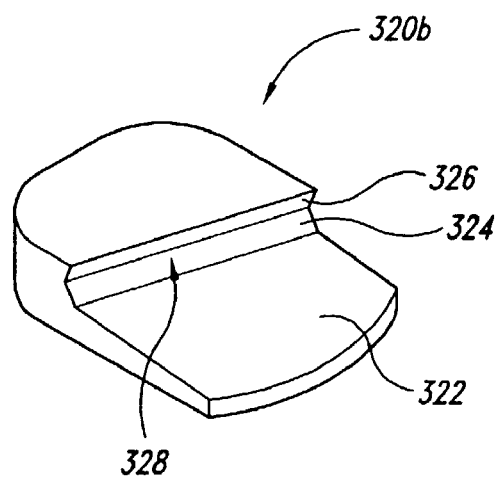
Figure 13:
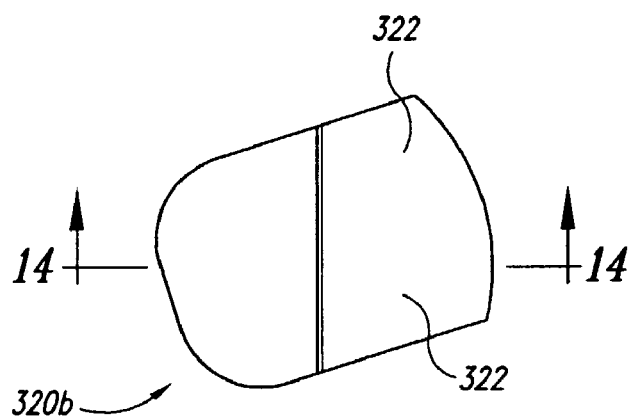
FIG. 13 is a top view of the stationary abutment of FIG. 12B.
Figure 14:
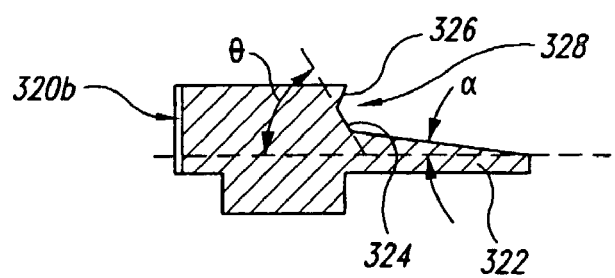
FIG. 14 is a cross-sectional view of the stationary abutment taking along line 14-14 in FIG. 13.

FIGS. 12-14 illustrate one embodiment of stationary abutments 320a-b useful in the end-effector 300. In particular, FIG. 12A illustrates the first stationary abutment 320a and FIG. 12B illustrates the second stationary abutment 320b. The first and second stationary abutment 320a-b have similar structures and generally include a base 322, a shoulder 324, an overhang 326 and a recess 328. The primary difference between the first stationary abutment 320a and the second stationary abutment 320b lies in the relative orientation of the recess 328. The orientation of the recess 328 in each of the stationary abutments 320 should be selected to ensure that an edge of the workpiece may be received therein when the stationary abutments 320 are carried on the legs 312. The end-effector 300 of FIGS. 6-14 may be used in connection with circular workpieces, such as semiconductor wafers. The first stationary abutment 320a of FIG. 12A and the second stationary abutment 320b of FIG. 12B, therefore, have recesses 328 oriented as tangents to the circular workpiece to be handled by the end-effector 300.

Given the similarity of the two stationary abutments 320a and 320b, FIGS. 13 and 14 only illustrate the second abutment 320b of FIG. 12B. As best seen in FIG. 14, the base 322 of the second stationary abutment 320b slopes in an upward direction moving toward the recess 328. As can be seen in FIG. 8, for example, the base 322 is oriented toward the proximal section 316 of the body 310 and the housing 330. As a consequence, the sloped base 322 slopes upwardly in a direction away from the housing 330. The base slopes upwardly at an incline angle $\alpha$ from horizontal. The shoulder 324 of the stationary abutment 320b slopes upwardly from the upper edge of the base at a different incline angle $\theta$. The incline angle $\theta$ of the shoulder 324 is greater than the incline angle $\alpha$ of the base 322. The overhang 326 slopes upwardly from the shoulder 324, but in the opposite direction, i.e., proximally back toward the housing 330.

As explained in more detail below, when a workpiece is first positioned for grasping by the end-effector 300, it will be placed in a workplace-receiving area generally defined between the first stationary abutment 320a, the second stationary abutment 320b and a movable abutment 354. An edge of the workpiece will initially rest on the sloped bases 322 of the stationary abutments 320. This will help space the workpiece upwardly away from the body 310 of the end-effector. As the actuator 350 moves the moveable abutment 352 inwardly toward the center of the workpiece-receiving area, the workpiece will be urged up the sloped bases 322 of the stationary abutments 320. The edge of the workpiece will then encounter the shoulder 324 and may slide up the shoulder until an upper edge of the workpiece engages the overhang 326. This will securely seat the edge of the workpiece in the recess 328 of the stationary abutment 320 at a predictable position. As a consequence, the overhang 326 may be just large enough to securely hold the workpiece to prevent it from falling out of the end-effector 300 when the end-effector 300 is inverted, but allow the workpiece to readily and predictably drop out of the end-effector 300 without undue interference from the overhang 326.

The end-effector 300 may include a housing 330 coupled to the proximal section 316 of the base 310. This housing 330 may generally include a shroud 332 coupled to a bottom plate 334 by any suitable means, such as bolts 336. The housing defines an enclosure 338 within which an actuator 350 and detector 390 may be housed.

The actuator 350 generally includes an actuator shaft 352, a guide plate 360, a channel member 370 and a driver 380. These elements may act in tandem to selectively control movement of a movable abutment 354 carried by the shaft 352, as explained below.

Figure 9:
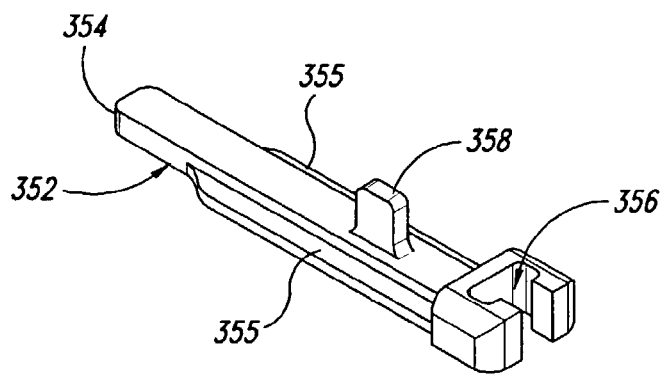
FIG. 9 is an isometric view of an actuator shaft useful in the end-effector of FIG. 6.
Figure 10:
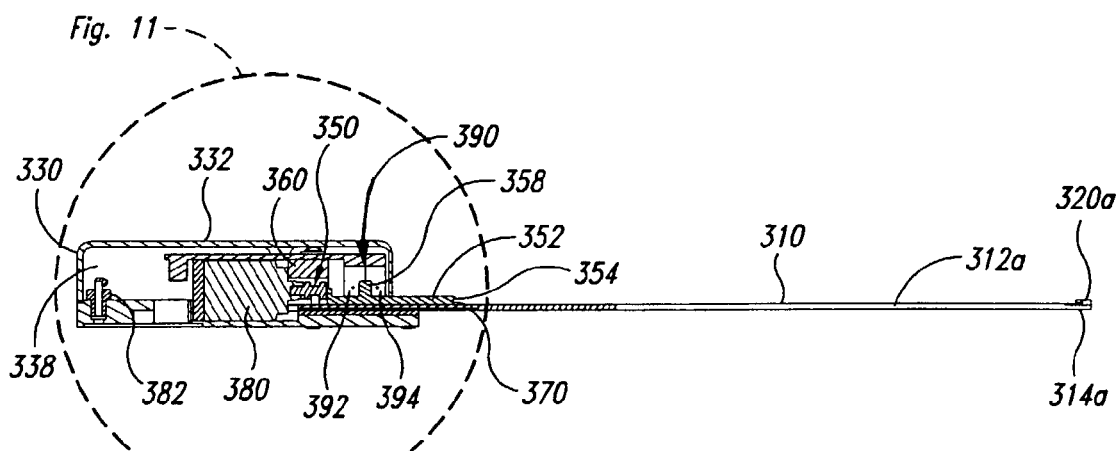
FIG. 10 is a side cross-sectional view taken along line 7-7 of FIG. 6.

As best seen In FIGS. 9 and 11, the shaft 352 includes a moveable abutment 354 at its distal end. A collar 356 may be provided at the proximal end of the shaft 352 to link the shaft 352 to a driver 380, as noted below. If so desired, a pair of wings may extend horizontally from opposite sides of the shaft 352. The wings can be slidably received between the channel member 370 and a lower surface of the guide plate 360 to help guide movement of the shaft 352 during operation. In the illustrated embodiment, the shaft 352 includes a flag 358 extending upwardly therefrom. As explained in more detail below, this flag 358 may cooperate with the detector 390 to monitor the position of the shaft 352 during operation.

The path of the shaft 352 is generally constrained by the guide plate 360 and the channel member 370. The guide plate 360 may be attached to the proximal section 316 by any suitable attachment, such as screws 364. The channel member 370 is sized to be received in the depression 317 in the proximal section 316 of the base 310. Attaching the guide plate 360 to the base 310 will, consequently, help retain the shaft 352 and the channel member 370 in place.

The guide plate 360 may include an elongate slot 362. The flag 358 of the shaft 352 may be slidably received within the slot 362 and move along the slot 362 when the driver 380 moves the movable abutment 354. To further ensure accurate guidance of the shaft 352, the channel member 370 may include an elongate channel 374 within which a lower portion of the shaft 352 is slidably received. The wings 355 help ensure an accurate vertical position of the shaft 352 and the guide plate slot 362 and the channel 374 together restrict horizontal movement of the shaft 352. As a consequence, the shaft 352 and its flag 358 are constrained to follow a relatively precise path as the shaft 352 is moved by the driver 380.

The distal end of the channel member 370 may include a ramp 372 which slopes upwardly in a proximal direction (i.e., toward the driver 380). This ramp 372 may provide an area on which an edge of the workpiece may initially rest. In a manner similar to the sloped base 322 of the stationary abutments 320, this ramp can help keep the workpiece spaced above the legs 312 of the base 310 and help guide an edge of the workpiece into a recess defined by the moveable abutment 354.

The driver 380 is adapted to move the shaft 352 of the actuator 350 inwardly toward the stationary abutments 320 and outwardly away from the stationary abutments 320. Any suitable motor may be employed. For example, an electrically-actuated solenoid may be used. Alternatively, the driver 380 may be a hydraulic or pneumatic piston which is connected to a fluid supply by appropriate fluid fittings 382. The driver 380 may be operatively connected to the shaft 352 in any desired fashion. In the illustrated embodiment, the driver 380 includes a link 384 having a head 385 sized to be closely received in the collar 356 of the shaft 352. In one embodiment, the driver 380 normally biases the shaft 352 inwardly toward engagement with a workpiece. In this manner, the end-effector 300 may retain its grip on the workpiece, even if the motive force of the driver 380 is lost. For example, if a pneumatic driver 380 is used, a spring (not shown) may be interposed between the driver 380 body and the actuator shaft 352 to urge the shaft 352 away from the driver 380 and toward the workpiece if pneumatic pressure is lost.

One embodiment of the invention includes a detector 390, which may be received within the enclosure 338 of the housing 330. This detector 390 is adapted to detect positive engagement of a workpiece by the movable abutment 354. In one embodiment, the detector 390 directly measures contact of the movable abutment with the workpiece, such as by including a pressure sensor associated with the movable abutment 354.

In the embodiment illustrated in FIGS. 6-14, the detector 390 is operatively associated with the actuator 350. More particularly, the detector 390 includes a first flag sensor 392a-b and a second flag sensor 394a-b. The first and second flag sensors 392a-b and 394a-b are spaced along the path along which the flag 358 is constrained to travel. In the illustrated embodiment, the flag 358 follows a straight, horizontal path, so the two flag sensors are horizontally spaced from one another. In another embodiment, the moveable abutment 354 is rotatably carried at the distal end of the shaft 352 and the driver 380 rotates the shaft 352 to advance or retract the shaft 352. In such an embodiment, a flag 358 extending outwardly from the shaft 352 proximally of the moveable abutment 354 may follow a circular or helical path. The flag sensors in such a design may be angularly and/or axially spaced from one another to detect the position of the flag 358 at two discrete positions along the path followed by the flag 358.

Each of the flag sensors may be adapted to detect the presence or proximity of the flag 358 at a particular location along the path of travel of the flag 358. The first and second flag sensors 392a-b and 394a-b may detect the flag in a variety of fashions. For example, the flag 358 may carry a magnet (not shown) and the first and second flag sensors 392a-b and 394a-b may be responsive to proximity of the magnet in the flag 358. In the illustrated embodiment, however, the first flag sensor includes a first light source 392a (FIGS. 10 and 11) and a first light sensor 392b (FIG. 8) which are positioned on opposite sides of the path of the flag 358. Similarly, the second flag sensor comprises a second light source 394a (FIGS. 10 and 11) and a second light sensor 394b (FIG. 8) which are positioned on opposite sides of the path of the flag 358. The flag 358 of the actuator 352 is desirably opaque to wavelengths of light emitted by the first and second light sources 392a and 394a. When the opaque flag 358 is positioned between the first light source 392a and the first light sensor 392b, it will interrupt the beam of light passing from the first light source 392a to the first light sensor 392b. This may generate a first flag position signal. Similarly, if the opaque flag 358 is positioned between the second light source 394a and the second light sensor 394b, the flag will interrupt the passage of light from the second light source 394a to the second light sensor 394b, which may generate a second flag position signal. The detector 390 may include a detector plate 396 which carries the first light source 392a, the first light sensor 392b, the second light source 394a, and the second light sensor 394b in the desired spatial relationship.

In operation, the actuator shaft 352 may be moved by the driver 380 between a retracted position and a deployed, workpiece-engaging position. When the actuator is in its retracted position, the movable abutment 354 is spaced farther away from the stationary abutments 320a-b, permitting a workpiece to be received between the three abutments. When the actuator shaft 352 is in this position, the first flag 358 may be positioned proximally of both the first light source 392a and the second light source 394a, as shown in phantom lines in FIG. 11. As the actuator shaft 352 is moved inwardly from the retracted position to the deployed position (shown in solid lines in FIG. 11), the flag 358 will interrupt the beam of light from the first light source 392a, generating the first flag position signal. If the driver 380 is energized and no first signal is detected, the detector 390 may generate a first error signal.

In normal operation, the movable abutment 354 of the actuator shaft 352 will engage an edge of a workpiece and grip the workpiece between the movable abutment 354 and the stationary abutments 320. The workpiece will, therefore, limit movement of the actuator 352 inwardly. As shown in FIG. 11, when the actuator is in its proper deployed position, the flag 358 may be positioned between the first light source 392a and the second light source 394a. As a consequence, the flag 358 will not interrupt the beam of light from either of the light sources 392a and 394a. As noted previously, the driver 380 may exert a predetermined urging force on the actuator shaft 352. If the movable abutment 354 fails to properly engage a workpiece and urge it into the recesses 328 of the stationary abutments 320, the workpiece will not impede further movement of the actuator shaft 352 toward the stationary abutments 320. As a consequence, the flag 358 may continue along its path until it interrupts the beam of light from the second light source 394*a*, generating the second flag position signal. The detector 390 may then generate a second error signal, which may differ from the first error signal, to indicate that the workpiece is not properly grasped by the end-effector 300.

After the end-effector 300 properly grasps a workpiece and moves it to its intended destination, the end-effector 300 may release the workpiece. This may be accomplished by moving the actuator shaft 352 from its deployed position to its retracted position. In doing so, the flag 358 of the actuator shaft 352 will interrupt the beam of light from the first light sensor 392*a*, generating the first flag position signal. If the detector 390 fails to receive the first flag position signal during retraction of the actuator shaft 352, the detector 390 may generate a third error signal, which may differ from the first and second error signals.

Hence, the particular embodiment of the invention shown in FIGS. 6-14 provides a mechanically simple system for reliably engaging a workpiece positioned between the movable abutment 354 and the stationary abutments 320. This embodiment also includes a detector 390 which can generate an appropriate error signal if the movable abutment 354 fails to properly engage an edge of the workpiece. By generating an error signal, the detector can avoid any mishap associated with moving the end-effector 300 without first properly grasping the workpiece. The error signals generated by the detector 390 may take a variety of forms, including visual or audible alerts to an operator. In an alternative embodiment, if the detector 390 generates the first error signal, the second error signal or the third error signal, operation of the transfer device 130 may be interrupted, preventing the transfer device 130 from moving the end-effector 300 until an operator can insure that the workpiece is properly gripped by the end-effector 300.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An end-effector for handling a microelectronic workpiece, comprising:
    a body;
    a plurality of spaced-apart abutments carried by the body, the plurality of abutments defining a workpiece-receiving area;
    a channel member carried by the body, the channel member having a proximal portion, a distal portion, a channel, and a ramp at the distal portion sloping upward toward the proximal portion;
    an actuator slidably received in the channel of the channel member, the actuator being associated with at least one of the abutments and adapted to move the associated abutment inwardly toward the workpiece-receiving area from a retracted position;
    a detector located at the end-effector and operatively associated with the actuator, the detector being adapted to generate an error signal if the associated abutment fails to engage an edge of a workpiece when the actuator moves the associated abutment inwardly; and
    wherein the actuator carries a flag and the detector comprises spaced-apart first and second flag sensors, and wherein the second flag sensor is positioned to detect movement of the flag beyond a position of the flag when the associated abutment engages the edge of the workpiece.

2. The end-effector of claim 1 wherein the abutment is adapted to move the associated abutment outwardly from a workpiece-engaging position to the retracted position to release the workpiece.

3. The end-effector of claim 2 wherein the detector is adapted to generate the error signal when the associated abutment moves inwardly beyond the workpiece-engaging position.

4. An end-effector for handling a microelectronic workpiece, comprising:
    a body;
    a plurality of abutments carried by the body at locations adapted to selectively engage an edge of a workpiece;
    an actuator having a shaft adapted to move inwardly from a retracted position to a deployed position in which an end of the shaft engages an edge of the workpiece, wherein the actuator is associated with at least one of the abutments, the actuator moving the associated abutment between a retracted position and a deployed position;
    a detector located at the end-effector adapted to detect engagement of the edge of the workpiece by at least one of the abutments, wherein the detector comprises spaced-apart first and second position sensors, the first position sensor generating a first signal when the actuator moves inwardly a predetermined distance from the retracted position, the second position sensor generating a second signal when the actuator moves inwardly beyond the deployed position, the detector being adapted to generate an error signal if the second position sensor generates the second signal; and
    wherein the actuator carries a flag and the first and second position sensors of the detector are positioned proximate to the flag and comprise spaced-apart first and second flag sensors, respectively, and wherein the second flag sensor is positioned to detect movement of the flag beyond a position of the flag when the associated abutment is in its deployed position.

5. The end-effector of claim 4 wherein one of the abutments is a moveable abutment moveable between a retracted position and a workpiece-engaging position, the moveable abutment engaging the edge of the workpiece when in its workpiece-engaging position and releasing the edge of the workpiece when in its retracted position.

6. The end-effector of claim 5 wherein the moveable abutment moves in a first direction in moving from its retracted position to its workpiece-engaging position, the detector detecting movement of the moveable abutment in the first direction beyond the workpiece-engaging position.

7. The end-effector of claim 6 wherein the detector is adapted to generate an error signal when the moveable abutment moves beyond the workpiece-engaging position.

8. An end-effector for handling a microelectronic workpiece, comprising:
    a body;
    spaced-apart, stationary first and second abutments carried by the body, and a moveable third abutment carried by the body opposite the first and second abutments, the three abutments together defining a workpiece-receiving area;
    an actuator comprising a shaft having an inward end carrying the third abutment and being adapted to move inwardly along a travel path from a retracted position to a deployed position wherein the third abutment engages a workpiece; and a detector located at the end-effector comprising spaced-apart first and second position sensors positioned adjacent the travel path of the shaft of the actuator, the first position sensor generating a first signal when the actuator moves inwardly a predetermined distance from the retracted position, the second position sensor generating a second signal when the actuator moves inwardly beyond the deployed position, the detector being adapted to generate an error signal if the second position sensor generates the second signal.

9. The end-effector of claim 8 wherein each of the first and second abutments comprises a sloped base sloping upwardly at an incline angle in a direction away from the third abutment, a sloped shoulder sloping upwardly from an upper edge of the base in a direction away from the third abutment, the shoulder having an incline angle greater than the incline angle of the base, and an overhang sloping upwardly from the shoulder in a direction toward the third abutment, the overhang and the shoulder together defining an angular edge-receiving recess.

* * * * *